(12) United States Patent
Powell et al.

(10) Patent No.: US 9,438,165 B2
(45) Date of Patent: Sep. 6, 2016

(54) RC OSCILLATOR

(71) Applicant: Silicon Laboratories Inc., Austin, TX (US)

(72) Inventors: Matthew R. Powell, Austin, TX (US); Axel Thomsen, Austin, TX (US); Nicholas M. Atkinson, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/509,754

(22) Filed: Oct. 8, 2014

(65) Prior Publication Data

US 2016/0105148 A1 Apr. 14, 2016

(51) Int. Cl.
*H03K 3/26* (2006.01)
*H03B 5/24* (2006.01)
*H03K 3/011* (2006.01)
*H03K 3/0231* (2006.01)

(52) U.S. Cl.
CPC ................. *H03B 5/24* (2013.01); *H03K 3/011* (2013.01); *H03K 3/0231* (2013.01)

(58) Field of Classification Search
CPC .... H03K 3/0231; H03K 3/011; H03K 3/354; H03K 4/502; H03K 3/03; H03K 4/501; H03K 3/012; H03L 1/022; H03L 1/00; H03L 7/00; H03L 7/02; H03L 1/026; H03L 7/097; H03L 1/02; H03L 7/0891; H03L 7/0995; H03L 7/181; H03B 5/24
USPC ......... 331/111, 143; 327/298, 131, 136, 132
See application file for complete search history.

(56) References Cited

U.S. PATENT DOCUMENTS

| | | | |
|---|---|---|---|
| 6,157,265 A * | 12/2000 | Hanjani | H03K 3/0231 327/298 |
| 2008/0290955 A1* | 11/2008 | Fort | H03K 3/011 331/57 |
| 2010/0013566 A1* | 1/2010 | Kim | H03K 4/502 331/111 |

\* cited by examiner

*Primary Examiner* — Arnold Kinkead
(74) *Attorney, Agent, or Firm* — Trop Pruner & Hu, P.C.

(57) ABSTRACT

A method includes using a current source to provide a charging current to a capacitor of a resistor-capacitor (RC) tank of an RC oscillator. The method includes using a resistor of the current source as a resistor for the RC tank.

14 Claims, 5 Drawing Sheets

RC OSCILLATOR

BACKGROUND

Clock signals may be used in an electronic system for such purposes as synchronizing operations of a processor, keeping track of time and initiating periodic activity. The clock signal is generated by an oscillator, and the frequency of the clock signal typically is regulated by controlling the frequency of the oscillator. One way to control the oscillator's frequency is through the use of a resistor-capacitor (RC) tank, or resonant circuit, which may be part of the same integrated circuit as the oscillator.

SUMMARY

In an example embodiment, a method includes using a current source to provide a charging current to a capacitor of a resistor-capacitor (RC) tank of an RC oscillator. The method includes using a resistor of the current source as a resistor for the RC tank.

In another example embodiment, an apparatus includes a resistor-capacitor (RC) tank circuit, a discharge path and a charge path. The RC tank is formed from a resistor and a capacitor and has an oscillation cycle. In a first part of the cycle, the capacitor is charged, and during a second part of the cycle the capacitor, the discharge path circuit discharges the capacitor. The charge path circuit communicates a charging current to the capacitor. The charge path circuit includes an amplifier to amplify a voltage of the capacitor to generate a signal to control coupling of the discharge path circuit to the capacitor.

In yet another example embodiment, an apparatus includes an integrated circuit, which includes a processor core and a clock system. The clock system includes clock sources, and the clock system is adapted to select a clock signal provided by a given clock source and provide the selected clock signal to at least one component of the integrated circuit. The given clock source includes a resistor-capacitor (RC) oscillator, which includes a current source and an RC tank circuit. The current source provides a regulated current and includes a resistor. The RC tank circuit includes a capacitor and also includes the resistor of the current source to establish a period of the clock signal.

Advantages and other desired features will become apparent from the following drawings, description and claims.

DETAILED DESCRIPTION

Figure 1:
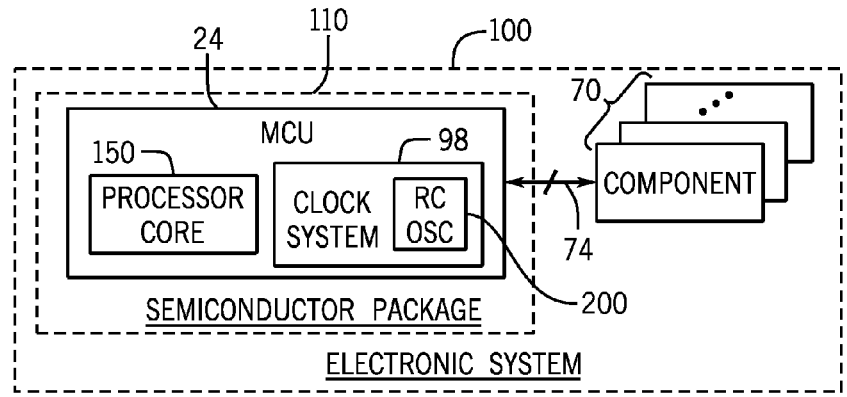
FIG. 1 is a schematic diagram of an electronic system according to an example embodiment.

An electronic system, such as a microcontroller unit (MCU)-based platform, may be constructed to perform activities using a relatively high frequency clock signal (a clock signal having a frequency in the MegaHertz (MHz) range, for example) and a relatively low frequency clock signal (a clock signal having a frequency in the kiloHertz (kHz) range, for example). For an MCU-based electronic system, the low frequency clock signal may be used for such purposes as supporting generation of a real time clock (RTC), providing a periodic wake up for the MCU to perform calibrations, allowing components of the system to check sensor inputs, or allowing other periodic activities.

Because the low frequency clock signal may be provided during a time of low power consumption for the electronic system, an oscillator providing the clock signal may also be constrained to have a relatively small power demand and thus, operate while consuming a relatively small overall current (a current of a few nanoamperes (nA), for example) while maintaining a reasonable accuracy (an accuracy around five percent, for example).

In accordance with example embodiments, the electronic system uses a resistor-capacitor (RC) oscillator, a relatively low power and accurate oscillator, to provide a low frequency clock signal. The RC oscillator has an RC tank (which may also be referred to as a "resonant circuit," "tank circuit," and so forth) that establishes the resonance frequency for the oscillator. The RC tank includes a resistor and a capacitor; and the oscillation frequency of the oscillator is proportional to the product of the resistor's resistance and the capacitor's capacitance.

For each cycle of oscillation, the RC oscillator charges and then discharges the capacitor of the RC tank. In this manner, the RC oscillator has a charge path circuit to provide a charging current to the capacitor to store energy in the capacitor during a charging part of the cycle, and the RC oscillator has a discharge path circuit to remove the stored energy from the capacitor during a discharging part of the cycle. The voltage of the capacitor rises during charging, and the capacitor is discharged in response to the voltage of the capacitor reaching a voltage that is related to (equal to, for example) the voltage that is generated by a current in a resistor of the RC oscillator.

In accordance with example embodiments, a current source of the RC oscillator provides the charging current that charges the capacitor of the RC tank, and a resistor of the current source serves dual functions: establishing the current that is provided by the current source; and functioning as the resistor of the RC tank. Moreover, in accordance with example embodiments disclosed herein, the charging path circuit of the RC oscillator contains a single-ended amplifier that is constructed to provide a first stage of amplification for a signal that controls coupling of the discharge path circuit to the capacitor at the end of the charging part of the oscillation cycle. In accordance with some embodiments, the amplifier of the charging path circuit may provide most of the amplification for the signal that controls the coupling/decoupling of the discharge path circuit.

Referring to FIG. 1, as a more specific example embodiment, an electronic system 100 includes a clock system 98 that contains multiple clock sources, including an RC oscillator 200. In particular, the clock system 98 selects and provides clock signals that may be used for a number of purposes, as further described herein.

The electronic system 100, in accordance with example embodiments, includes a microcontroller unit (MCU) 24, which controls various aspects of one or more components 70 of the electronic system 100. In general, the MCU 24 communicates with the components 70 via communication input/output (I/O) signals 74, which may be wireless signals; hardwired cables-based signals; and so forth, depending on the particular embodiment. As examples, the components 70 may include such components as a lighting element; an electrical motor; a household appliance; an inventory control terminal; a computer; a tablet; a smart power meter; a wireless interface; a cellular interface; an interactive touch screen user interface; and so forth.

As depicted in FIG. 1, in accordance with example embodiments, all or part of the components of the MCU 24 may be part of a semiconductor package 110. In this manner, all or part of the components of the MCU 24 may be fabricated on a single die or on multiple dies, depending on the particular embodiment, and encapsulated to form the semiconductor package 110.

Figure 2:
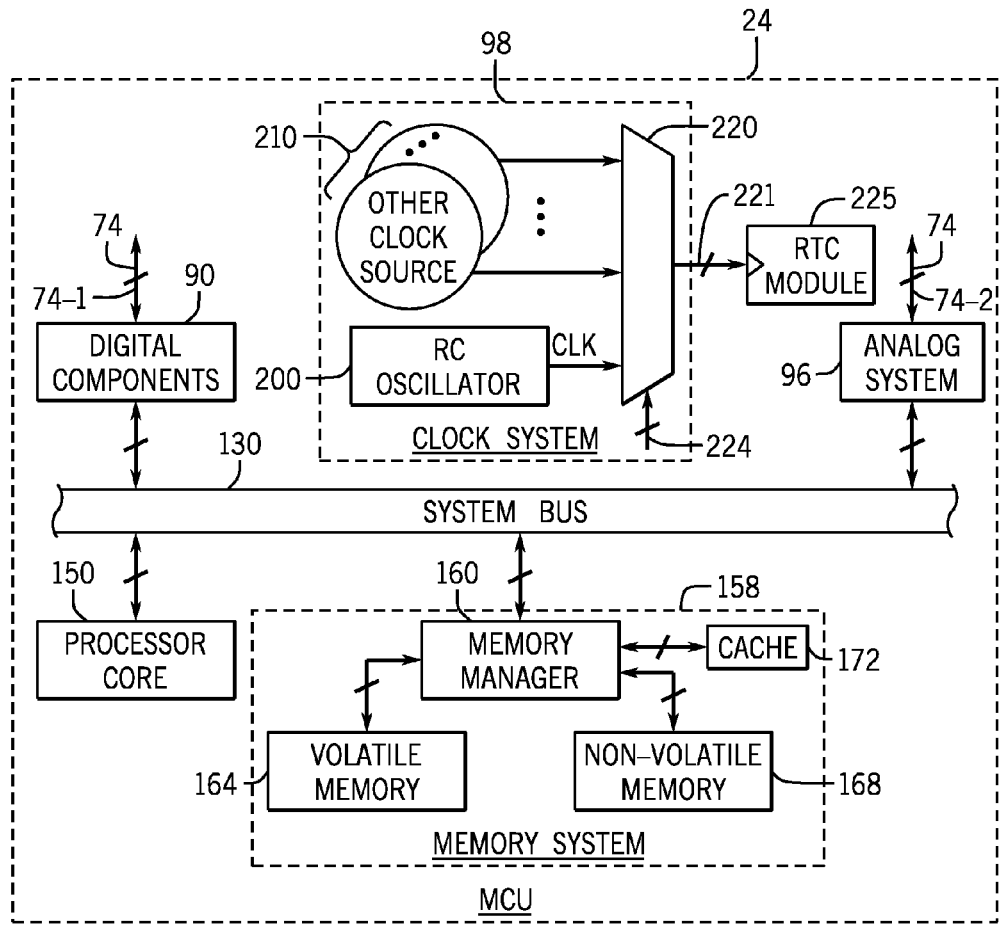
FIG. 2 is a schematic diagram of a microcontroller unit (MCU) of the electronic system of FIG. 1 according to an example embodiment.

Referring to FIG. 2 in conjunction with FIG. 1, in accordance with example embodiments, the MCU 24 contains a processor core 150, digital components 90 and an analog system 96. As an example, the processor core 150 may be a 32-bit core, such as an Advanced RISC Machine (ARM) processor core, which executes a Reduced Instruction Set Computer (RISC) instruction set. In further example embodiments, the processor core 150 may be a less powerful core, such as an 8-bit core (an 8051 core, for example). The digital components 90 may be, as examples, a Universal Serial Bus (USB) interface; a universal asynchronous receiver/transmitter (UART) interface; a system management bus interface (SMB) interface; a serial peripheral interface (SPI) interface; timers; and so forth. In general, the digital components 90 may communicate with devices that are external to the MCU 24 via associated I/O signals 74-1.

The analog system 96 may include various analog components and systems that receive analog signals, such as analog-to-digital converters (ADCs) and comparators; as well as analog components that provide analog signals, such as current drivers. In general, the analog system 96 communicates with devices that are external to the MCU 24 via associated I/O signals 74-2.

Among its other components, the MCU 24 includes a system bus 130 that is coupled to the digital components 90, analog system 96 and processor core 150. A memory system 158 is also coupled to the system bus 130. The memory system includes a memory controller, or manager 160, which controls access to various memory components of the MCU 24, such as a cache 172, a non-volatile memory 168 (a Flash memory, for example) and a volatile memory 164 (a static random access memory (SRAM), for example). In accordance with example embodiments, the volatile memory 164 and the non-volatile memory 168 may form the system memory of the MCU 24. In other words, the volatile memory 164 and the non-volatile memory 168 have memory locations that are part of the system memory address space for the MCU 24.

It is noted that FIG. 2 depicts a general simplified representation of an example MCU architecture, as the MCU 24 have many other components, bridges, buses, and so forth, in accordance with further embodiments, which are not depicted in FIG. 2. For example, in accordance with further example embodiments, the MCU 24 may have a bus matrix module that responds to slave side arbitration to regulate access to the memory devices of the MCU 24. Thus, many other embodiments are contemplated, which are within the scope of the appended claims.

The clock system 98 provides one or multiple clock signals at its output(s) 221, which may be used in the MCU 24 for any of a number of purposes, depending on the particular embodiment. As depicted in FIG. 2, in some embodiments, the clock system 98 may provide a clock signal to a real time clock (RTC) module 225 of the MCU 24. The RTC module 225, in accordance with example embodiments, is essentially a counter that stores data in a way that allows components of the MCU 24 to request a time or a date. The RTC module 225 may include a scheduler to start a given activity or send an interrupt to the processor core 150 when a particular time is reached.

In further embodiments, a clock signal that is provided by the clock system 98 may be used to run a dedicated digital engine, such that a short cycle of activity (10 to twenty clock cycles, for example) by the digital engine begins in response to the rising edges of the clock signal. In accordance with example embodiments, the clock system 98 may alternate the frequency of a clock signal between relatively high (MHz frequencies, for example) and low (kHz frequencies, for example) frequencies to initiate analog and digital cycles of activity. In this manner, the clock system 98 may regulate provide a relatively low frequency clock signal for several cycles to change analog states, subsequently provide a relatively high frequency clock signal for several cycles initiate digital activity and then the circuitry enters a waiting state for the next low frequency rising clock edge.

In further embodiments, a the clock system 98 may provide a relatively low frequency clock signal that is used to clock a digital watchdog timer of the MCU 24 such that if no activity occurs for a certain number of low frequency clock cycles, the MCU 24 takes a predetermined action due to the inactivity. For example, after a certain number of low frequency cycles of inactivity, the MCU 24 may power down components for purposing of reducing power consumption. As another example, the MCU 24 may reset one or more components after a certain number of low frequency cycles of inactivity, as the inactivity may indicate a hung state.

Figure 3:
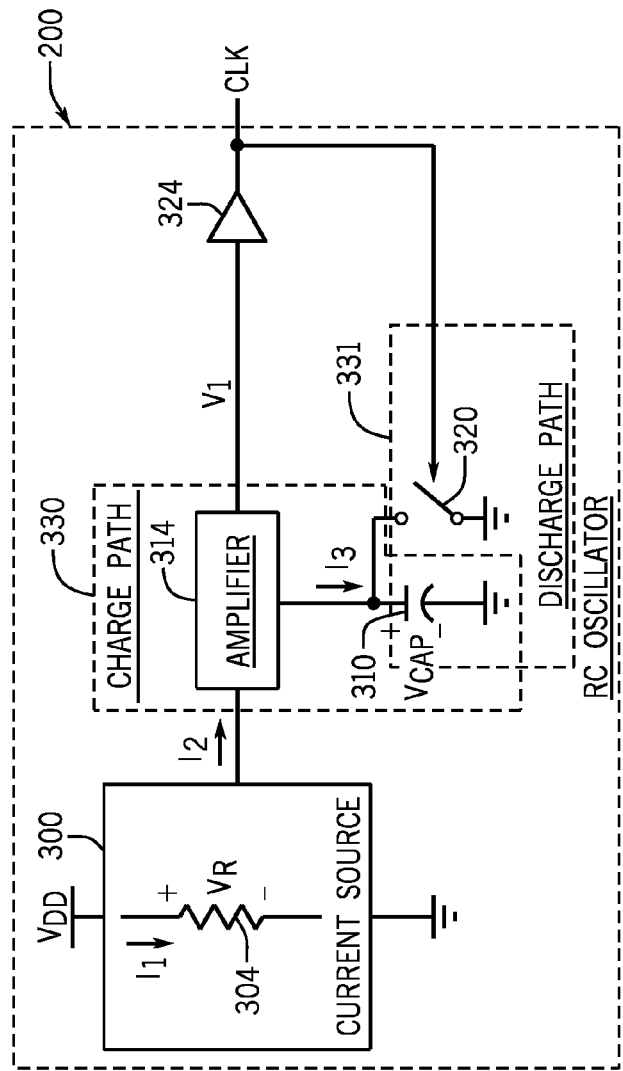
FIG. 3 is a schematic diagram of a resistor-capacitor (RC) oscillator according to an example embodiment.

For a relatively low frequency clock signal, the clock system 98 may select a clock signal (called "CLK" in FIG. 2), which is provided by the RC oscillator 200. The clock system 98 may have one or multiple other clock sources 210, which generally provide different frequency clock signals for the MCU 24 and which may be selected by the clock system 98 for purposes of providing the system's clock signal(s). FIG. 2 schematically depicts selection of the clock sources via a multiplexer 220 that may be controlled (via selection signals 224 provided the processor core 150, for example) for purposes of selecting the appropriate frequency clock signal(s) that are provided at the output(s) 221 of the clock system 98. Referring to FIG. 3, in accordance with example embodiments, the RC oscillator 200 includes a current source 300; and an RC tank, which is formed from a capacitor 310 and a resistor 304. As depicted in FIG. 3, in accordance with example embodiments, the resistor 304 of the RC tank is part of the current source 300.

The RC oscillator 200 charges and discharges the capacitor 310 in each oscillation cycle of the oscillator 200 to correspondingly form one cycle of the CLK clock signal.

The charging of the capacitor 310 occurs in a charging part of the oscillation cycle. In this part of the cycle, the current source 300 provides a relatively fixed, or constant, current (called "$I_2$" in FIG. 3), which produces a charging current (called "$I_3$") in a charge path circuit (called a "charge path 330" herein) for the capacitor 310. In accordance with some embodiments, the magnitude of the $I_3$ charging current is generally proportional to (equal to, for example) the magnitude of the $I_2$ current. In the charging part of the cycle, the capacitor 310 charges in response to the $I_3$ charging current, and a voltage of the capacitor 310 (called "$V_{CAP}$" in FIG. 3) corresponding ramps upwardly.

In accordance with example embodiments, the charge path 330 contains a single-ended amplifier 314 that amplifies the $V_{CAP}$ capacitor voltage (as described further herein) to provide a voltage (called "$V_1$" in FIG. 3) that is used to control the coupling and decoupling of a discharge path circuit (called a "discharge path 331 in FIG. 3) to/from the capacitor 310; and as such, $V_1$ voltage serves as a signal to control when the charging and discharging parts of the oscillation cycle begin and end.

For the example embodiment that is depicted in FIG. 3, the discharge path 331 is form by a controlled current path, or switch 320. In this manner, for the charging part of the cycle, the switch 320 does not conduct, or is turned off; and during the charging cycle, the $V_1$ voltage generally increases in magnitude over time as the capacitor 310 is being charged and the $V_{CAP}$ capacitor voltage rises. As described further below, due to the charging of the capacitor 310, the $V_1$ voltage eventually reaches a voltage, which causes the switch 320 to conduct, or turn on, and consequently begin the discharging part of the cycle in which the capacitor 310 is discharged through the switch to ground. The discharging of the capacitor 310, in turn, causes the $V_1$ and $V_{CAP}$ voltages to decrease; and the lowered $V_1$ voltage causes the switch 320 to turn off, thereby ending the charging part of the current cycle and beginning the charging part of the next cycle.

The magnitude of the $I_2$ current is generally inversely proportional to the resistance of the current source's resistor 304, in accordance with example embodiments. In this manner, as depicted in FIG. 3, the current source 300 produces a current (called "$I_1$" in FIG. 3) in the resistor 304, which is proportional in magnitude to the magnitudes of the $I_2$ and $I_3$ currents. The $I_1$ current produces a voltage (called "$V_R$" in FIG. 3) across the resistor 304. The $V_{CAP}$ capacitor voltage charges at a time rate that is proportional to the $I_2$ current divided by the capacitance of the capacitor 310. Because the $I_3$ and $I_1$ currents are proportional, the cycle time, in accordance with example embodiments, is proportional to the product of the resistance of the resistor 304 and the capacitance of the capacitor 310 and is independent of the $I_1$, $I_2$ and $I_3$ currents, and when the $V_{CAP}$ capacitor voltage reaches a threshold voltage that is proportional to the resistance of the resistor 304 and the $I_1$ current, the charging of the capacitor 310 ends and the discharging of the capacitor 310 begins. The cycle time is the threshold voltage divided by the time rate, in accordance with example embodiments. The charging part of the oscillation cycle is proportional to the product of the resistance of the resistor 304 and the capacitance of the capacitor 310. In accordance with example embodiments, the discharging part of the cycle is a set by a propagation delay time (described below); and the product of the resistance of the resistor 304 and the capacitance of the capacitor 310 establishes the periodic frequency of the oscillation cycle.

In accordance with example embodiments, the RC oscillator 200 includes a digital buffer 324 that pulse shapes the $V_1$ voltage (i.e., sharpens the rising and falling edges of the $V_1$ voltage) to provide the CLK signal at the output of the buffer 324. It is noted that depending on the particular embodiment, the oscillator 200 may contain frequency dividers and other circuitry to change the frequency of the CLK signal, change the duty cycle of the CLK signal, and so forth. As described further herein, in accordance with example embodiments, the propagation delay of the digital buffer 324 sets the duration of the discharge part of the oscillation cycle.

Figure 5:
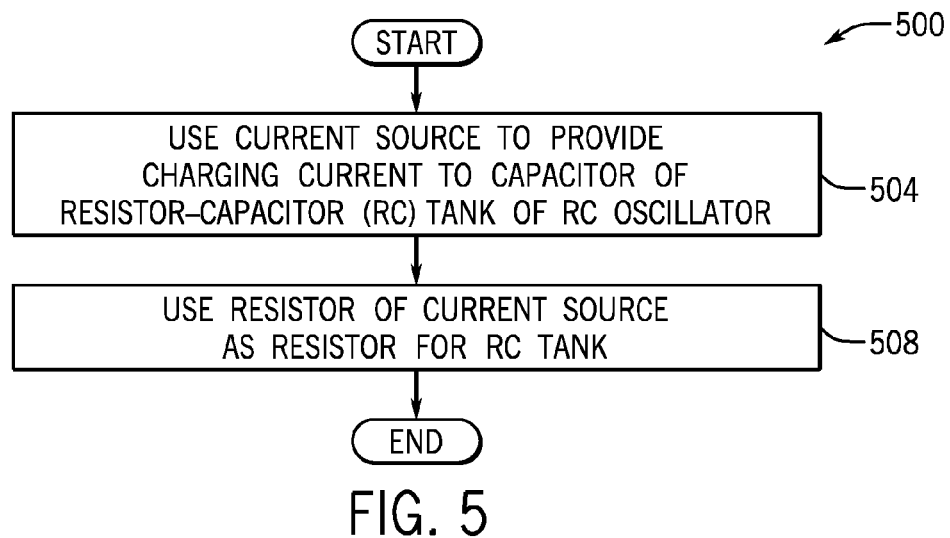
FIG. 5 is a flow diagram depicting a technique to use a resistor of a current source as the resistor for an RC tank of an RC oscillator according to an example embodiment.

Thus, referring to FIG. 5, in accordance with example embodiments, a technique 500 includes using (block 504) a current source to provide a charging current to a capacitor of a resistor-capacitor (RC) tank of an RC oscillator. Pursuant to the technique 500, a resistor of the current source is used (block 508) as a resistor for the RC tank.

A potential advantage of using a resistor of a current source as part of the RC tank is that die area is conserved (i.e., one less resistor is used). Another potential advantage is that current (and therefore power consumption) may be reduced due to the use of part of the current source for dual functions.

Figure 4:
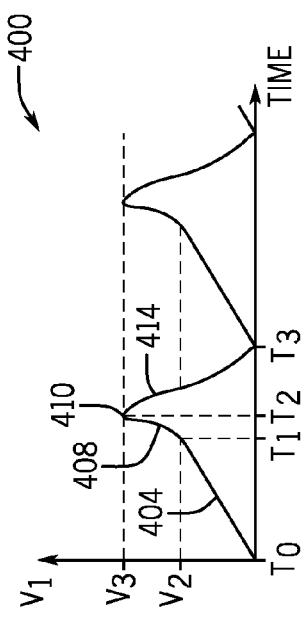
FIG. 4 is a waveform of a voltage generated by a capacitor charge path circuit of the oscillator of FIG. 3 according to an example embodiment.

Referring back to FIG. 3, in accordance with some embodiments, a particular advantage of having the single-ended amplifier 314 disposed in the charge path 330 is that the amplifier 314 may be used in place of an input stage of a comparator that may otherwise be used to amplify the $V_{CAP}$ capacitor voltage. In this manner, the amplifier 314, in accordance with example embodiments, provides most of the amplification for the CLK signal that controls the coupling of the discharge path circuit 331 to the capacitor 310. FIG. 4 depicts an example magnitude versus time waveform of the $V_1$ voltage for an example oscillation cycle from time $T_0$ to time $T_3$. Charging of the capacitor 310 occurs from time $T_0$ to time $T_2$; and discharging of the capacitor 310 occurs from time $T_2$ to time $T_2$.

From time $T_0$ (when the capacitor 310 discharged) to time $T_1$, the magnitude of the $V_1$ voltage generally linearly ramps upwardly and generally follows the corresponding ramping of the $V_{CAP}$ capacitor voltage. Near or at time $T_1$, the magnitude of the $V_1$ voltage reaches a threshold voltage magnitude (called "$V_2$" in FIG. 4), which is set by the resistance of the resistor 304.

As further described herein, when the magnitude of the $V_1$ voltage reaches the $V_2$ threshold at time $T_1$ the amplification that is applied by amplifier 314 of the charge path 330 increases. While the $V_{CAP}$ capacitor voltage is lower than the $V_2$ voltage, the $V_1$ voltage is slightly higher than the $V_{CAP}$ capacitor voltage. As the $V_{CAP}$ capacitor voltage approaches and exceeds the $V_2$ voltage, the $V_1$ voltage increases rapidly from time $T_1$ to time $T_2$, as depicted in FIG. 4, which causes the voltage at the control terminal of switch 320 to a larger magnitude (called "$V_3$" in FIG. 4) turn on the switch 320 and trigger discharging of the capacitor 310. The discharging the capacitor 310 occurs from time $T_2$ to time $T_3$. At time $T_3$, the capacitor 3120 is discharged and the switch 320 opens to begin another oscillation cycle.

Figure 6:
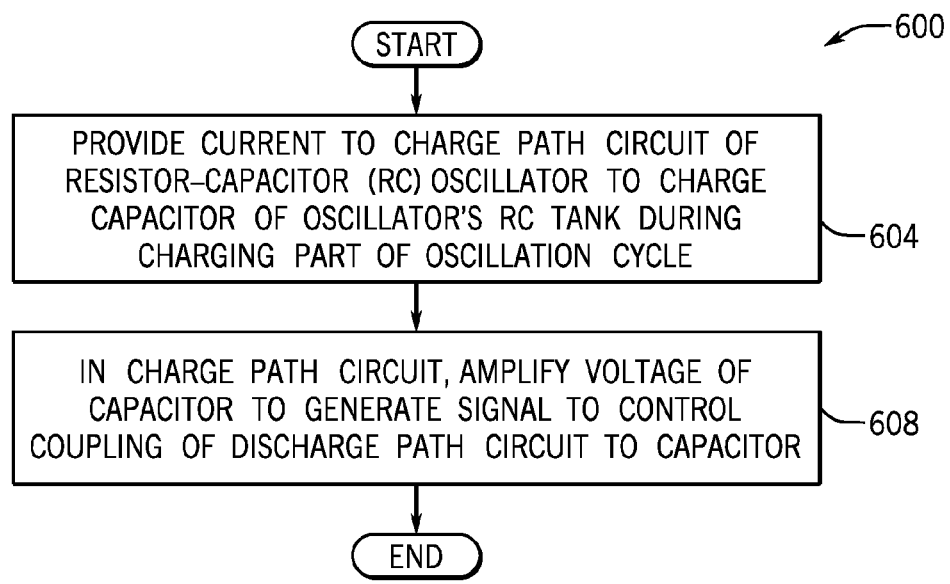
FIG. 6 is a flow diagram depicting a technique to generate a signal to control coupling of a discharge path circuit to a capacitor of an RC tank of an RC oscillator according to an example embodiment.

Thus, referring to FIG. 6, in accordance with example embodiments, a technique 600 includes providing (block 604) a current to a charge path circuit of an RC oscillator to charge a capacitor of the oscillator's RC tank during the charging part of the oscillator's cycle. The technique 600 further includes amplifying a voltage of the capacitor to generate a signal to control coupling of a discharge path circuit of the RC oscillator to the capacitor.

A potential advantage in using an amplifier in the charge path is that die area, otherwise consumed by a comparator, for example, may be conserved; and another potential advantage is that power may be conserved due to reduction in circuitry.

Figure 7:
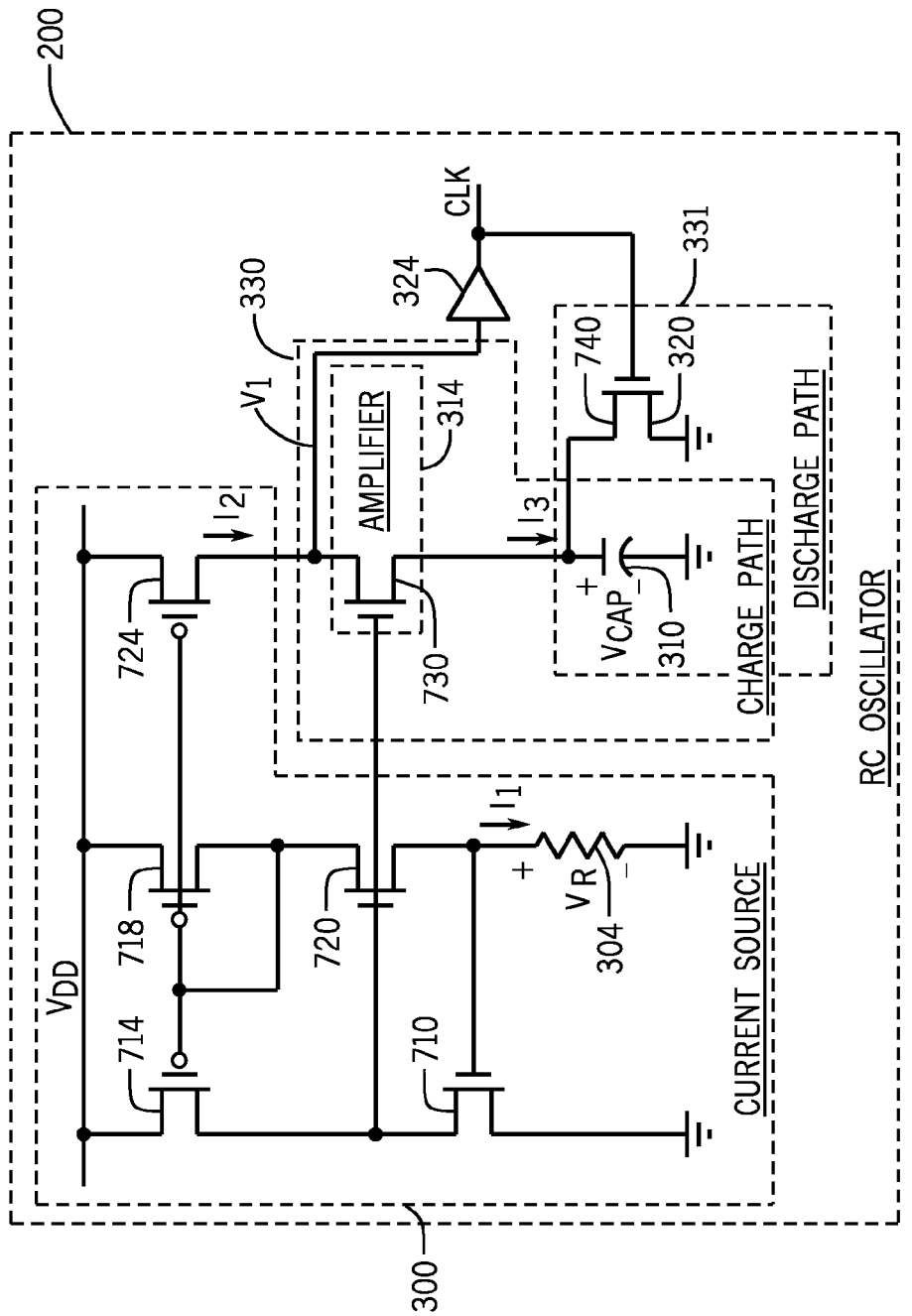
FIG. 7 is a more detailed schematic diagram of the RC oscillator of FIG. 3 according to an example embodiment.

Referring to FIG. 7, in accordance with example embodiments, the current source 300 is a $V_{GS}/R$ current source circuit, which is a self-biased current source. The current source 300 includes an N-channel metal-oxide-semiconductor field-effect-transistor (NMOSFET) 710, which has its gate and source coupled across the resistor 304. Thus, the voltage across the resistor 304 is equal to the gate-to-source ($V_{GS}$) of the NMOSFET 710; and the magnitude of the $I_1$ current is equal to the quotient of the $V_{GS}$ voltage of the NMOSFET 710 divided by the resistance of the resistance 204. For this example embodiment, the source of the NMOSFET 710 is coupled to ground; one terminal of the resistor 304 is coupled to ground; and the other terminal of the resistor 304 is coupled to the gate of the NMOSFET 710. An NMOSFET 720 of the current source 300 has its source coupled to the gate of the NMOSFET 710, and a gate of the NMOSFET 720 is coupled the drain of the NMOSFET 710.

A current mirror of the current source 300, which is formed from P-channel MOSFETs (PMOSFETs) 714 and 718, mirrors the $I_1$ current into the drain-to-source path of the NMOSFET 710 (i.e., into the current-controlled path of the NMOSFET 710). In this regard, the source of the PMOSFET 718 is coupled to the $V_{DD}$ supply voltage, and the drain of the PMOSFET 718 is coupled to the drain of the NMOSFET 720. Moreover, the gate and drain of the PMOSFET 718 are coupled together. The source of the PMOSFET 714 is coupled to the $V_{DD}$ supply voltage, a gate of the PSMOFET 714 is coupled to the gate and drain of the PMOSFET 718; and the drain of the PMOSFET 714 is coupled to the drain of the NMOSFET 710.

In accordance with example embodiments, the $I_1$ current has a magnitude equal to the gate-to-source voltage ($V_{GS}$) of the NMOSFET 710 divided by the resistance (R) of the resistor 304, or $V_{GS}/R$, which may be approximated as "$V_t/R$" (where "$V_t$" represents the MOSFET threshold voltage of the NMOSFET 710).

As depicted in FIG. 7, the current source 300 further includes a PMOSFET 724 that additionally mirrors the $I_1$ current to produce the $I_2$ current in the charge path 330. The $I_2$ current is proportional to the $I_1$ and may be equal to, a multiple of, or a fraction of the $I_1$ current, depending on the relative aspect ratios of the PMOSFETs 718 and 724. The source of the PMOSFET 724 is coupled to the $V_{DD}$ supply voltage; the gate of the PMOSFET 724 is coupled to the gates of the PMOSFETs 714 and 718; and the drain of the PMOSFET 724 provides the $I_2$ current.

The amplifier 314 of the charge path 330 includes an NMOSFET 730, in accordance with example embodiments. In this regard, the $I_2$ current passes through the drain-to-source path of the NMOSFET 730 and, for this example, is near or equal to the $I_3$ current, as negligible current is assumed to be communicated to the digital buffer 324. The drain of the NMOSFET 730 is coupled to the drain of the PMOSFET 724; the gate of the NMOSFET 730 is coupled to the gate of the NMOSFET 720; and the source of the NMOSFET 730 is coupled to the input of the current buffer 324 and the non-ground terminal of the capacitor 310.

Also for the example embodiment depicted in FIG. 7, the switch 320 includes an NMOSFET 740, whose drain-to-source path is coupled across the capacitor 310. The gate of the NMOSFET 740 is coupled to the CLK clock signal, i.e., coupled to the output of the digital buffer 324.

The digital buffer 324 may take on numerous forms, depending on the particular embodiment. In an example embodiment, the digital buffer 324 is formed from an even number of serially-coupled complementary metal-oxide-semiconductor (CMOS) inverters (i.e., a CMOS inverter chain).

The RC oscillator 200 operates as follows. In general, the NMOSFETs 720 and 730 are considered to be matching transistors for this example embodiment. The effective charging reference voltage is determined by the $V_R$ resistor voltage. As long as the $V_{CAP}$ capacitor voltage is less than the $V_R$ resistor voltage, the currents through the drain-to-source paths of the NMOSFETs 720 and 730 are equal or fixed ratios of each other, depending on the aspect ratios of the PMOSFETs 718 and 724.

When the capacitor 310 is being charged, the NMOSFET 740 does not conduct, or is "turned off," and the $V_{CAP}$ capacitor voltage has a relatively low magnitude. Due to the charging of the capacitor 310, the $V_{CAP}$ capacitor voltage ramps upwardly. The NMOSFET 730 is operating in a linear mode of operation during the initial charging of the capacitor 310, which causes the magnitude of the $V_1$ voltage to generally follow the magnitude of the $V_{CAP}$ voltage. When the $V_{CAP}$ capacitor voltage reaches the $V_R$ resistor voltage, the magnitude of the $I_3$ current decreases abruptly, due to the gates of the NMOSFETs 720 and 730 being coupled together and the NMOSFET 730 turning off. The PMOSFET 724 pulls the $V_1$ voltage to or near the $V_{DD}$ supply voltage, the $I_2$ current decreases and the NMOSFET 740 turns on. Thus, at this point, the charge path 330 is decoupled from the capacitor 310, and the discharge path 331 is coupled to the capacitor 310.

In accordance with example embodiments, the digital buffer 324 introduces a propagation delay that sets the duration of the discharging part of the oscillation cycle. In this manner, the turning on of the PMOSFET 724 causes the $V_1$ voltage to be pulled toward ground. However, the appearance of the lower $V_1$ magnitude at the gate of the NMOSFET 740 is delayed by the propagation delay of the digital buffer 324. The propagation delay of the digital buffer 324 (or other introduced delay, depending on the particular embodiment) is selected to ensure that the capacitor 310 is fully discharged before the charging part of the cycle begins. As an example, in accordance with some embodiments, the propagation delay is a function of the number of CMOS inverters that are used to form the digital buffer 324.

Figure 8:
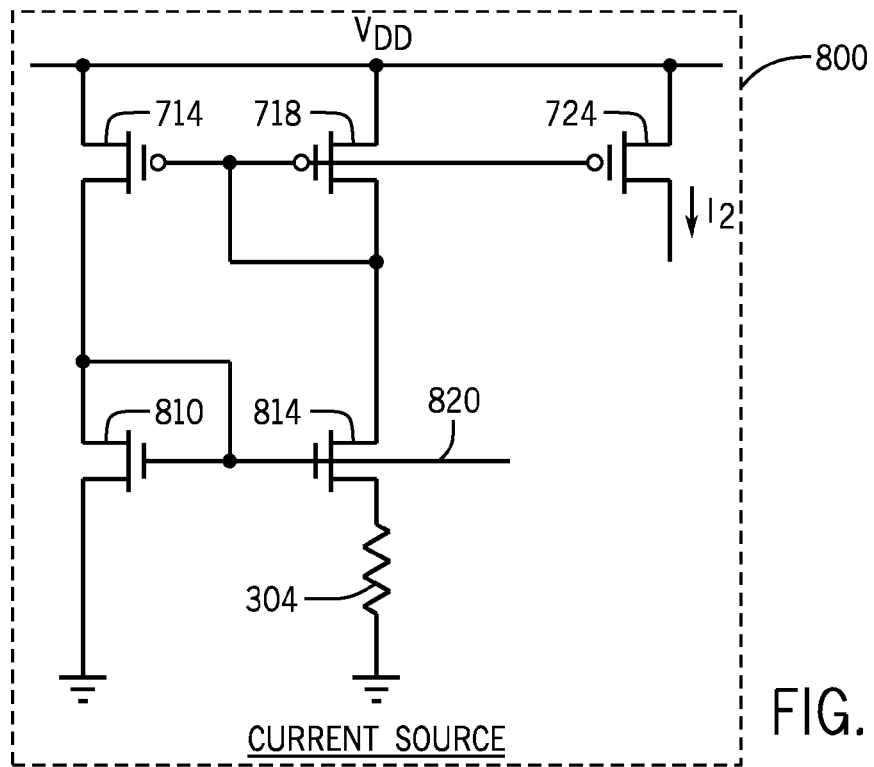
FIG. 8 is a schematic diagram of a current source according to a further example embodiment.

Other embodiments are contemplated, which are within the scope of the appended claims. In this manner, FIG. 8 depicts a current source 800 in accordance with a further example embodiment. The current source 800 is a delta $V_{GS}/R$ current source circuit. Elements of the current source 800 shared in common with the current source 300 are denoted using similar reference numerals. The current source 800 has NMOSFETs 810 and 814 that replace the NMOSFET 710 of the current source 300. In this regard, the NMOSFET 810 has its source coupled to ground and its drain and gate coupled together. Moreover, the drain of the NMOSFET 810 is coupled to the drain of the PMOSFET 714. The gate of the NMOSFET 814 is coupled to the gate of the NMOSFET 810, the source of the NMOSFET 814 is coupled to node 305, and the drain of the NMOSFET 814 is coupled to the gate and drain of the PMOSFET 718. Moreover, the gates of the NMOSFETs 810 and 814 are coupled (as indicated by terminal 820) to the NMOSFET 730 (see FIG. 7).

In accordance with example embodiments, the $I_2$ current has a magnitude that generally proportional to "($V_{GS1}$−

$V_{GS2})/R$," where "$V_{GS1}$" and "$V_{GS2}$" represent the gate-to-source voltages of the NMOSFETs 810 and 814, respectively; and "R" represents the resistance of the resistor 304. The $V_{GS1}-V_{GS2}$ voltage is largely determined by the relative aspect ratios of the PMOSFETs 718 and 714 and the relative aspect ratios of NMOSFETs 814 and 810, which also set the relative current densities in the NMOSFETs 810 and 814. In some embodiments 810 and 814 could be chosen have different threshold voltages, and the $I_2$ current may be approximated as "$(V_{t1}-V_{t2})/R$," where "$V_{t1}$" and "$V_{t2}$" represent the MOSFET threshold voltages of the NMOS-FETs 810 and 814, respectively.

The RC oscillator may use other current sources, in accordance with further embodiments.

Figure 9:
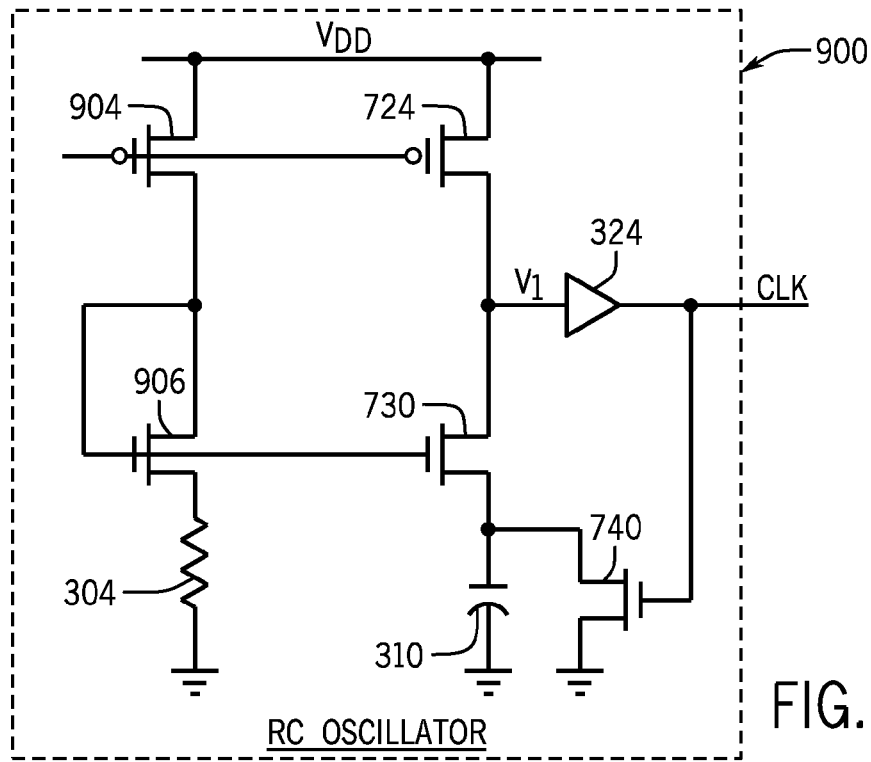
FIG. 9 is a schematic diagram of an RC oscillator according to a further example embodiment.

As another example of a further embodiment, FIG. 9 depicts an RC oscillator 900 that does not include a current source, but rather, the resistor 304 of the RC tank receives a reference current. In general, the RC oscillator 900 has features similar to other RC oscillators discussed herein, with the same reference numerals being used to denote similar components and different reference numerals being used to denote the new features. Unlike the oscillator 200, for the oscillator 900, a PMOSFET 904 mirrors a current from a current source (not depicted in FIG. 9), and this mirrored current is routed through the resistor 304, which is coupled in series with the source-to-drain path of the PMOS-FET 904. Moreover, an NMOSFET 906 has its drain-to-source path coupled in series with the source-to-drain path of the PMOSFET 904 and the resistor 304. As shown in FIG. 9, the drain and gate of the NMOSFET 906 are coupled together; and the gate of the NMOSFET 906 is coupled to the gate of the NMOSFET 730. The resistor 304 is coupled between the source of the NMOSFET 906 and ground.

As yet another example of a further example embodiment, the circuitry that is described herein may be replaced by equivalent CMOS circuitry in which the PMOSFETs and NMOSFETS are interchanged, as can be appreciated by one of ordinary skill in the art.

While a limited number of embodiments have been disclosed herein, those skilled in the art, having the benefit of this disclosure, will appreciate numerous modifications and variations therefrom. It is intended that the appended claims cover all such modifications and variations.

What is claimed is:

1. A method comprising:
using a current source to provide a charging current to a capacitor of a resistor-capacitor (RC) tank of an RC oscillator;
using a resistor of the current source as a resistor for the RC tank; and
communicating the charging current to the capacitor using a charging path, wherein using the charging path comprises communicating the charging current to the capacitor using an amplifier and using the amplifier to amplify the voltage to generate a signal to turn on a discharge path to discharge the capacitor, wherein using the amplifier to amplify the voltage comprises operating a first transistor in a linear mode of operation to communicate the charging current to the capacitor and transitioning the first transistor to an off state near or at the end of a first part of an oscillation cycle for the RC oscillator to increase the amplification of the signal.

2. The method of claim 1, further comprising using a resistance of the resistor to regulate the charging current.

3. The method of claim 1, wherein:
the first transistor has a controlled current path in series with the capacitor; and
using the resistor comprises providing a second transistor having a controlled current path in series with the resistor and coupling control terminals of the first and second transistors together.

4. The method of claim 1, further comprising:
using the RC oscillator in a clock system for an electronic device to provide a relatively low frequency clock signal to change a state of an analog component of the electronic device and using a clock source of the clock system other than the RC oscillator to provide a relatively high frequency clock signal to change a state of a digital component of the electronic device.

5. The method of claim 1, further comprising activating a transistor to discharge the capacitor.

6. The method of claim 1, wherein using the current source comprises using a $V_{GS}/R$ current source or a delta $V_{GS}/R$ current source to provide the charging current.

7. An apparatus comprising:
a resistor-capacitor (RC) tank circuit formed from a resistor and a capacitor and having an oscillation cycle comprising a first part of the cycle in which the capacitor is charged and a second part of the cycle in which the capacitor is discharged;
a discharge path circuit to discharge the capacitor during the second part of the cycle; and
a charge path circuit to communicate a charging current to the capacitor, wherein the charge path circuit comprises an amplifier to communicate the charging current and to amplify a voltage of the capacitor to generate a signal to control coupling of the discharge path circuit to the capacitor, wherein the amplifier comprises a transistor to operate in a linear mode of operation to communicate the charging current to the capacitor and transition to an off state near or at the end of the first part of the cycle to increase the amplification of the signal.

8. The apparatus of claim 7, wherein the amplifier comprises a single-ended amplifier to amplify the voltage.

9. The apparatus of claim 7, wherein the discharge path circuit comprises a switch to be selectively turned on by the signal to discharge the capacitor.

10. The apparatus of claim 7, further comprising a digital buffer to reshape the voltage of the capacitor to generate a clock signal.

11. An apparatus comprising:
an integrated circuit comprising a processor core and a clock system comprising a plurality of clock sources and being adapted to select a clock signal provided by a given clock source of the plurality of clock sources and to provide the selected clock signal to at least one component of the integrated circuit, wherein the given clock source comprises a resistor-capacitor (RC) oscillator comprising:
a current source to provide a regulated current and comprising a resistor;
an RC tank circuit comprising the resistor and a capacitor to establish a period of the clock signal; and
a charge path circuit to charge the capacitor using a charging current, wherein the charge path circuit comprises an amplifier to communicate the charging current to the capacitor and amplify a voltage of the capacitor to generate a signal to control operation of a discharge circuit to discharge the capacitor,
wherein the RC oscillator is associated with an oscillation cycle, and the amplifier comprises a first transistor to operate in a linear mode of operation to communicate the charging current to the capacitor and transition to an off state near or at the end of a first part of the oscillation cycle to increase the amplification of the signal.

12. The apparatus of claim 11, wherein a resistance of the resistor controls a magnitude of the charging current.

13. The apparatus of claim 11, wherein the current source comprises:
   a second transistor having a first controlled current path in series with the resistor;
   a third transistor having a second controlled current path in series with the capacitor; and
   a current mirror to couple the first and second controlled current paths together.

14. The apparatus of 11, wherein the current source comprises a $V_{GS}/R$ current source or a delta $V_{GS}/R$ current source.

* * * * *